United States Patent [19]

Ren et al.

[11] 4,077,039

[45] Feb. 28, 1978

[54] LAUNCHING AND/OR RECEIVING NETWORK FOR AN ANTENNA FEEDHORN

[75] Inventors: Chung-Li Ren; Han-Chiu Wang, both of Andover, Mass.

[73] Assignee: Bell Telephone Laboratories, Incorporated, Murray Hill, N.J.

[21] Appl. No.: 752,165

[22] Filed: Dec. 20, 1976

[51] Int. Cl.[2] .................... H01Q 13/00; H03H 9/00

[52] U.S. Cl. .................... 343/786; 333/73 W

[58] Field of Search .................... 343/729, 755, 776, 786

[56] References Cited

U.S. PATENT DOCUMENTS

| | | | |
|---|---|---|---|
| 3,274,604 | 9/1966 | Lewis | 343/786 |
| 3,696,434 | 10/1972 | Sciambi | 343/776 |
| 3,936,838 | 2/1976 | Foldes | 343/786 |
| 4,030,048 | 6/1977 | Foldes | 343/786 |

*Primary Examiner*—Alfred E. Smith
*Assistant Examiner*—Harry Barlow
*Attorney, Agent, or Firm*—Erwin W. Pfeifle

[57] ABSTRACT

A launching and/or receiving network is disclosed capable of coupling radio signals in a first frequency band, e.g., 2 GHz into and/or out of an existing antenna system without perturbing the signals being transmitted in other frequency bands, e.g., 4, 6 and/or 11 GHz. The first frequency band signal is launched through an evanescent mode waveguide filter which is both coupled to the flared sidewall of a feedhorn through an H-plane, T-junction, and provides a very broad stopband for the signals in the other frequency bands being launched in the feedhorn. To minimize mode conversion for the signals in the other frequency bands, a dummy evanescent mode waveguide filter is connected at one end thereof to the feedhorn facing the first frequency band launching network and at the other end thereof to a matched load through a waveguide section. A second launching and/or receiving network can be similarly coupled to the feedhorn in a plane normal to the first network to permit a different orthogonally polarized beam, at the first frequency band, to be simultaneously transmitted and/or received by each of the two networks.

6 Claims, 3 Drawing Figures

LAUNCHING AND/OR RECEIVING NETWORK FOR AN ANTENNA FEEDHORN

BACKGROUND OF THE INVENTION

1. Field of the Invention

The present invention relates to a launching and/or receiving network for an antenna system and, more particularly to a launching and/or receiving network for a microwave antenna system which is capable of launching signals in a first frequency band through a feedhorn of, for example, an existing antenna system without perturbing the transmission of signals in other frequency bands also being launched in the feedhorn.

2. Description of the Prior Art

Present telecommunication microwave radio systems generally transmit signals in the frequency bands of 4, 6 and 11 GHz. In multiplexing or demultiplexing the individual frequency bands for transmission by a directive antenna system, prior art systems have used various waveguide elements in the transmission line to the feedhorn such as Y-junctions, directional couplers, polarization separator-mixers and predistorted microwave filters in branching networks. In this regard see, for instance, U.S. Pat. Nos. 3,543,188 issued to R. M. Livingston on Nov. 24, 1970; 3,816,835 issued to N. Bui-Hai et al on June 11, 1974 and 3,943,519 issued to N. Bui-Hai on Mar. 9, 1976.

Where frequency bands other than the three 4, 6 and 11 GHz frequency bands are to be transmitted over a single antenna system and where these other frequency bands are not supportable by the waveguide transmission line used for the 4, 6 and 11 GHz signals, prior art arrangements have generally used a separate waveguide transmission line and feedhorn for launching and receiving the other frequency bands directly to and from a reflector. In this regard see, for instance, U.S. Pat. No. 3,763,493 issued to S. Shimada et al on Oct. 2, 1973.

Under certain conditions, however, it may not be possible to add a separate feedhorn such as, for example, in the throat of a horn-reflector antenna, and especially when it is desired to add a new frequency band to an existing microwave telecommunication system, which new frequency band is not supportable by the existing waveguide connected to the feedhorn. The problem, therefore, remaining in the art is to provide an arrangement for launching and/or receiving electromagnetic waves in a first frequency band through a feedhorn which is used to launch and/or receive electromagnetic waves in one or more other frequency bands without perturbing these latter other frequency band signals.

BRIEF DESCRIPTION OF THE INVENTION

The present invention relates to a network for launching and/or receiving electromagnetic waves in a first frequency band at a feedhorn used to launch and-/or receive electromagnet waves in one or more other frequency bands without perturbing these latter other frequency bands.

It is an aspect of the present invention to provide a network for launching and/or receiving electromagnetic waves in a first frequency band at a feedhorn which launches and/or receives electromagnetic waves in one or more other frequency bands without perturbing these latter other frequency bands where the main waveguide connected to the feedhorn is of a dimension which will not support the first frequency band signals.

The above aspects are realized with the present network which comprises a first and a second evanescent mode waveguide filter where each filter is coupled at a first end thereof to a feedhorn at a separate diametrically opposed location on the flared sidewall of the feedhorn through a H-plane, T-junction and at the other end thereof to a waveguide transmission line capable of supporting the first frequency band signals and to a load, respectively.

Other and further aspects of the present invention will become apparent during the course of the following description and by reference to the accompanying drawings.

BRIEF DESCRIPTION OF THE DRAWINGS

Referring now to the drawings, in which like numerals represent like parts in the several views.

DETAILED DESCRIPTION

The present invention is described hereinbelow primarily with the utilization of an existing horn-reflector antenna to transmit and/or receive an additional frequency band, of for example, 2 GHz without perturbing the operation in existing 4, 6 and 11 GHz frequency bands being launched and/or received in the feedhorn. It will be understood, however, that such description is exemplary only and for the purpose of exposition and not for purposes of limitation. It will be readily appreciated that the inventive concept described is equally applicable to multiplexing or demultiplexing a first frequency band and any other frequency band at a feedhorn where, for instance, the waveguide feeding the other frequency band to the feedhorn will not support the first frequency band.

Figure 1:
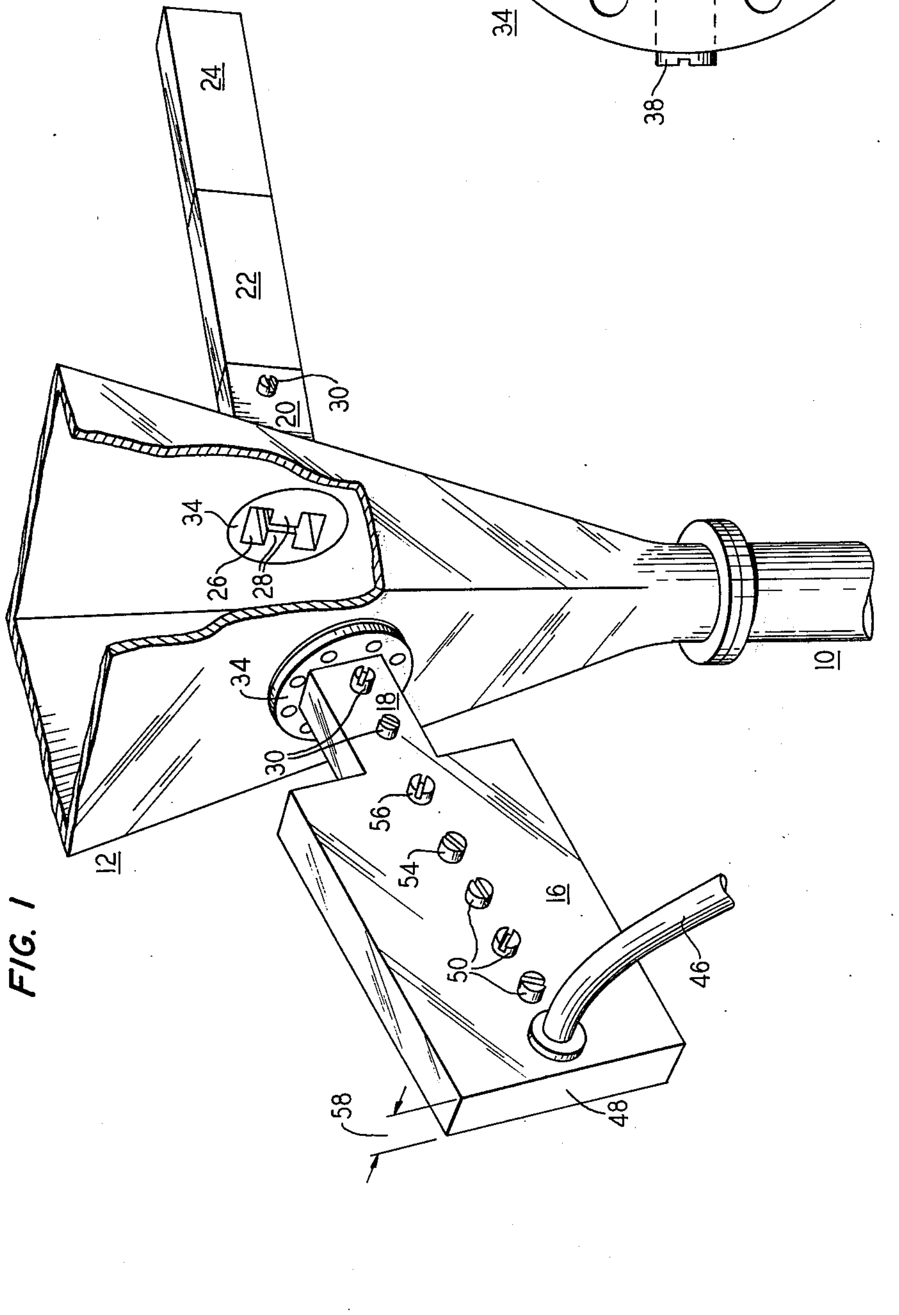
FIG. 1 is a view in perspective of a flared feedhorn and the connected launching network according to the present invention with a portion of the feedhorn removed for purposes of clarity.

Referring to FIG. 1, there is shown a feedhorn assembly comprising a circular waveguide 10 and a flared horn 12 for launching and/or receiving electromagnetic waves in, for example, one or more of the 4, 6 and 11 GHz frequency bands. In transmitting the exemplary one or more 4, 6 or 11 GHz signals, the signals propagate through circular waveguide 10 in the $H_{11}$ mode and are then transduced into the $H_{10}$ mode as the cross section of flared horn 12 tapers from circular into square before the signals are launched toward a reflector assembly (not shown). Circular waveguide 10 is of a size to support the exemplary one or more 4, 6 or 11 GHz frequency bands such as, for example, the waveguide commonly obtainable under the code WC281. Since such circular waveguide is below cut-off for signals in, for example, the 2 GHz frequency range, the launching and/or receiving of such signals must be accomplished by means other than circular waveguide 10.

In accordance with the present invention, the exemplary 2 GHz signal is propagated in a waveguide section 16 and is launched or received through an evanescent mode waveguide filter 18 which is coupled to flared horn 12 through a H-plane, T-junction. The evanescent mode waveguide filter 18 is designed to pass the exemplary 2 GHz signal but has a very broad stopband for the one or more 4, 6 or 11 GHz signals.

To minimize mode conversion for the one or more 4, 6 or 11 GHz signals, a dummy evanescent mode waveguide filter 20 is added to the feedhorn 12 facing the 2 GHz launching network to preserve the symmetry in horn 12. The dummy filter 12 has the same filter characteristics as waveguide filter 18, and is connected through a wave-guide section 22 to a suitable load in waveguide section 24. The waveguide section 22 is below cut-off for the 2 GHz signal to prevent 2 GHz power loss through dummy filter 20.

More particularly, to minimize perturbation to the one or more 4, 6 or 11 GHz signals, it is essential to limit the magnitude of the disturbance to their electromagnetic field patterns inside feedhorn 12, and to preserve their symmetry. By nature of the oversized boundary in feedhorn 12, the one or more 4, 6 or 11 GHz signals are relatively insensitive to small alterations of the feedhorn wall. It is, therefore, possible to couple the 2 GHz signal into feedhorn 12 through an aperture 26, but this aperture must be kept as small as possible. Ordinarily, a resonant cavity (or cavities) is required through which the 2 GHz signal can be fed into the horn through a small aperture without suffering appreciable reflection and with meaningful bandwidth. Unfortunately, most conventional resonant cavities at 2 GHz will also have resonances at $n \times 2$ GHz with $n = 2, 3, 4, \ldots$ Such resonant cavities are, therefore, not suitable for certain applications, and especially for the exemplary application described hereinabove.

The evanescent mode waveguide filter 18 has the advantageous unique characteristic of a broad stopband. In principle, filter 18 may be designed with an evanescent mode waveguide for frequencies up to 11 GHz, and to have a passband at 2 GHz and a broad stopband covering all 4, 6 and 11 GHz bands. However, this will impose a constaint on the size of the evanescent mode waveguide and, consequently, impose certain limitations in its application. For example, a very small evanescent mode waveguide will result in a very narrow applicable passband and as the evanescent mode waveguide becomes smaller the capacitive posts therein becomes more sensitive in dimensional tolerance and the intrinsic loss of the filter structure increases.

To launch and/or receive the exemplary 2 GHz signal, evanescent mode waveguide filter 18 can be formed from, for example, a rectangular waveguide with a cross section of 0.900 inches $\times$ 0.400 inches, commonly available by the code WR90, which is below cut-off for 2, 4 and 6 GHz, but above cut-off for the 11 GHz frequency band. Thus, filter 18 is designed as an evanescent mode filter tuned to have a passband at 2 GHz and a stopband covering 4 and 6 GHz frequency bands. Filter 18 is also a conventional direct coupled waveguide filter with a stopband for the 11 GHz signal.

The present network must additionally launch the 2 GHz signal in that phase plane of feedhorn 12 where only the dominant mode of the 2 GHz signal is propagating so as to attain maximum coupling and to suppress excitation of undesirable spurious modes. The coupling mechanism between the evanescent mode waveguide filters 18 and 20 and the horn 12 consists of a centered T-junction between the evanescent mode waveguide and feedhorn 12, and a bisected post 28 which constitutes, in part, the junction resonator of filters 18 and 20. The transverse magnetic field of the $H_{10}$ mode in the evanescent mode waveguide of filter 18 is coupled to the longitudinal magnetic fields in feedhorn 12. Bisected capacitive post 28 is geometrically symmetrical about the plane bisecting the narrow side of the T-junction. In this manner the 2 GHz signal is launched by filter 18 in the dominant $H_{10}$ mode, the cross-polarized $H_{10}$ mode being a propagating mode in the horn which is undesirable but which could be excited if the capacitive post 28 were made asymmetrical.

All other spurious modes are far below cut-off in the phase plane at the T-junction and are not excited, except possibly the $H_{11}$ mode which is not too far below cut-off. However, the $H_{11}$ mode is not excited by the symmetrically bisected capacitive post arrangement and as a result, the exemplary 2 GHz signal is launched free from any spurious modes.

The bisected capacitive post 28 can also be used to provide a practical means of adjustment to electrically compensate for minor mechanical asymmetries of a fabricated network due to tolerances in manufacture, thus to achieve very low excitation of the cross-polarized $H_{10}$ mode and the $H_{11}$ mode.

Advantageously, the coupling mechanism consisting of a relatively small opening and the associated relatively large capacitive post 28 at the T-junction of filter 18 introduces a small discontinuity in the form of I-shaped opening 26 for the 4, 6 and 11 GHz whose effect should be negligible as far as the dominant mode is concerned. However, such coupling mechanism may still cause system degradations due to mode conversions, since for the 4, 6 and 11 GHz signals, the feedhorn 12 is a multimode waveguide region. Any discontinuity in this region will introduce mode conversions. The number of spurious modes is reduced in accordance with the present invention by compensating for the asymmetry of the discontinuity introduced by the I-shaped opening 26 in the metallic wall of the feedhorn.

As illustrated in FIG. 1, an identical T-junction and a dummy evanescent mode waveguide filter 20 of identical design to filter 18 is added to the opposite wall of the feedhorn 12 to provide symmetry. The combined network would then appear as a discontinuity symmetrical about the center axis of the horn 12. Thus all spurious $H_{mn}$ modes above cut-off for the 4, 6 and 11 GHz signals with $m$ = even, such as the $H_{2n}$ mode, and $n$ = odd, such as the $H_{ml}$ mode, will not be excited. The spurious modes that may still be excited will be $H_{12}$ or higher, and they are at comparatively lower levels.

The dummy evanescent mode waveguide filter 20 has the same stopbands for the one or more 4, 6 or 11 GHz signals, and is terminated in a waveguide section 22 which is below cut-off signals up to 6 GHz to prevent power loss to the signals from 2 to 6 GHz through dummy filter 20. The load in waveguide section 24 preserves the stopband of the direct coupled bandpass filter 20 at 11 GHz.

Figure 2:
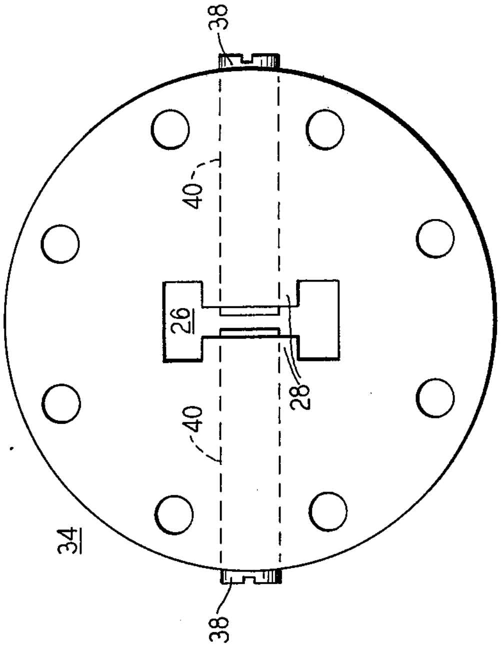
FIG. 2 is an end view of a flange forming a part of the preferred embodiment of the evanescent mode waveguide filter employed in the launching network according to the present invention.

Filters such as evanescent mode waveguide filters 18 and 20 are known in the art and have been described, for example, in U.S. Pat. No. 3,621,483 issued to G. F. Craven on Nov. 16, 1971. Filters 18 and 20 are each a three section bandpass filter constructed with evanescent mode waveguide, that is to say, all modes in such filter are evanescent at the operating frequency of the system. A capacitance screw 30 is generally positioned in each of the sections. As shown in FIG. 2, however, in the section of filters 18 and 20 nearest feedhorn 12, a bisected capacitance post 28 is formed in a flange 34 to mount filters 18 and 20 to feedhorn 12, the bisected post 28 being used in place of the common capacitance screw for maintaining electromagnetic field symmetry in feedhorn 12 and for minimizing spurious mode excitation and mode conversions. A large tuning screw 38 can advantageously be positioned in a threaded aperture 40 in one or both halves of bisected post 28 in flange 34 to permit the fine tuning of the desired center frequency.

Figure 3:
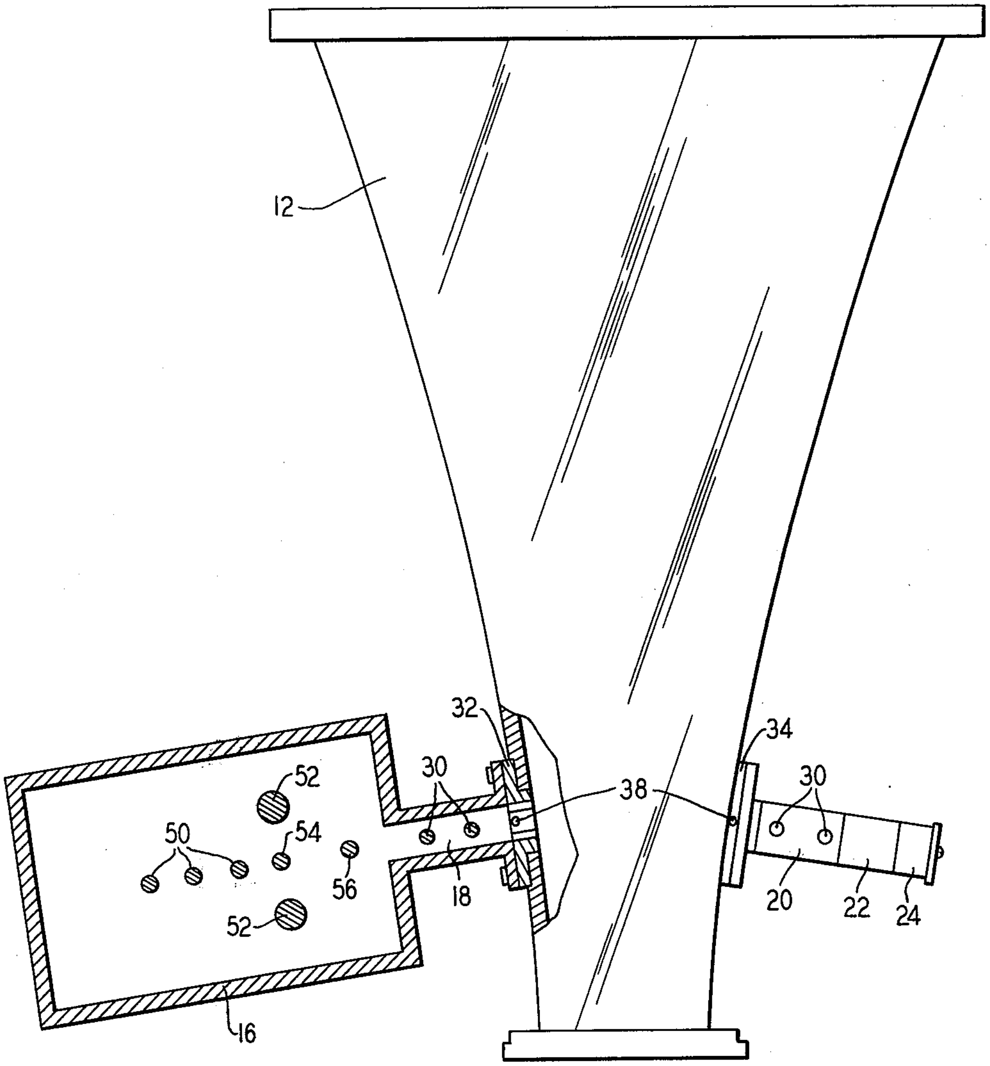
FIG. 3 is a partial sectional view in side elevation of the feedhorn and connected launching network according to the present invention.

Waveguide section 16 can comprise any suitable waveguide section which will support the signal being propagated between filter 18 and a receiving or transmitting circuit (not shown). FIGS. 1 and 3 illustrate a typical configuration which can be used for waveguide section 16 where the signals to and/or from the receiving or transmitting circuit are carried over a coaxial transmission line 46 which is terminated adjacent sealed end 48 of waveguide section 16 using any suitable method such as, for example, a coaxial to waveguide transducer. It is to be understood that the following description for waveguide section 16 is exemplary only and is for the purpose of exposition and not for purposes of limitation since any other suitable arrangement known in the art also can be used.

The exemplary configuration shown in FIGS. 1 and 3 for waveguide section 16 functions to intensify or increase the coupling of the rectangular waveguide section 16 to evanescent mode waveguide filter 18. Waveguide section 16 is shown as comprising in sequence from the coaxial line termination point (*a*) three screws 50 aligned parallel to the longitudinal axis of waveguide section 16 which are impedance matching elements (*b*) two inductive posts 52 (FIG. 3) mounted in a plane normal to the longitudinal axis of waveguide section 16 with a capacitive screw 54 mounted therebetween to provide adjustment of coupling when the posts 52 are not precisely located and (*c*) a capacitive screw 56 for tuning a desired center frequency of the cavity between posts 52 and the inlet to filter 18.

For utilization of the system capacity to its entirety, the transmitting and receiving signals in a microwave radio system are transmitted separately on each of two orthogonal polarizations (e.g., vertical and horizontal polarizations). Thus, the signals must be launched or extracted accordingly in the feedhorn 12. The present exemplary 2 GHz launcher and/or receiver is applicable for such dual-polarization systems, because it is capable of launching and/or receiving a signal in one polarization without the excitation of a cross-polarized mode (orthogonal). Dual polarizations may be launched in the same phase plane of feedhorn 12 with four centered T-junctions, each T-junction being mounted on a separate sidewall of the cross section. One pair of the T-junctions, which are facing each other, is used for launching the horizontal polarization and the other pair of T-junctions, which are facing each other, are used for launching the vertical polarization. The components associated with each launcher network are the same as shown in FIG. 1. Since this arrangement is also symmetrical about the axis of the horn 12, the launching scheme still suppresses the same modes for the one or more 4, 6 or 11 GHz signals as explained in discussion hereinbefore.

As shown in FIG. 1, waveguide section 16 can have its height 58 reduced to equal that of evanescent mode waveguide filter 18 which advantageously causes an intensification of the field within waveguide section 16 and permits ease of manufacture.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A network for an antenna for either launching or receiving signals in a first frequency band, the antenna comprising a flared feedhorn and a waveguide transmission line which will support signals in a second frequency band, the network comprising:

a first evanescent mode waveguide filter coupled at a first end thereof to a first sidewall of the flared portion of the feedhorn through an H-plane, T-junction and at a second end thereof to a waveguide section capable of propagating signals at the first frequency band, said first waveguide filter being dimensioned and tunable to pass the first frequency band signals and to have a very broad stopband for the second frequency band signals; and a second evanescent mode waveguide filter coupled at a first end thereof to a second sidewall of the flared portion of the feedhorn through an H-plane, T-junction at a location directly opposite and facing said first waveguide filter and at a second end thereof to a load termination, said second waveguide filter having the same filter characteristics as said first waveguide filter.

2. A network according to claim 1 wherein the first and second evanescent mode waveguide filters are each coupled to the feedhorn through an I-shaped opening formed from a central inwardly-extending bisected capacitive post.

3. A network according to claim 2 wherein at least one of the halves of the bisected capacitive post includes a threaded aperture for mounting a tuning screw for the fine tuning of a desired center frequency in the first frequency band at the opening.

4. A network according to claim 2 wherein said bisected capacitive post forms the capacitive waveguide element in the section of the first and second evanescent mode waveguide filters nearest said feedhorn.

5. A network according to claim 1 wherein the waveguide section coupled to the second end of said first evanescent mode waveguide filter has a height dimension which substantially corresponds to the height dimension for said first evanescent mode waveguide filter to intensify the field within said waveguide section.

6. Apparatus for an antenna for either launching or receiving two orthogonally polarized signals in a first frequency band, the antenna comprising a flared feedhorn and a waveguide transmission line which will support signals in a second frequency band, the apparatus comprising:

a first network oriented to either launch or receive a first one of the two orthogonally polarized signals comprising a first evanescent mode waveguide filter coupled at a first end thereof to a first sidewall of the flared portion of the feedhorn through a T-junction and at a second end thereof to a waveguide section capable of propagating signals at the first frequency band, said first waveguide filter being dimensioned and tunable to pass the first frequency band signals and to have a very broad stopband for the second frequency band signals, and a second evanescent mode waveguide filter coupled at a first end thereof to a second sidewall of the flared portion of the feedhorn through a T-junction at a location directly opposite and facing said first waveguide filter and at a second end thereof to a load termination, said second waveguide filter having the same filter characteristics as said first waveguide filter; and a second network oriented to either launch or receive a second one of the two orthogonally polarized signals comprising a first evanescent mode waveguide filter coupled at a first end thereof to a third sidewall of the flared portion of the feedhorn through a T-junction and at a second end thereof to a waveguide section capable of propagating signals at the first frequency band, said first waveguide filter being dimensioned and tunable to pass the first frequency band signals and to have a very broad stopband for the second frequency band signals, and a second evanescent mode waveguide filter coupled at a first end thereof to a fourth sidewall of the flared portion of the feedhorn through a T-junction at a location directly opposite and facing said first waveguide filter and at a second end thereof to a load termination, said second waveguide filter having the same filter characteristics as said first waveguide filter.

* * * * *